(12) United States Patent
Schweninger

(10) Patent No.: US 8,766,154 B2
(45) Date of Patent: Jul. 1, 2014

(54) OPTO-ELECTRONIC MEASURING ARRANGEMENT WITH ELECTRO-OPTICAL BASIC COUPLING

(71) Applicant: Mechaless Systems GmbH, Bruchsal (DE)

(72) Inventor: Erhard Schweninger, Karlsruhe (DE)

(73) Assignee: Mechaless Systems GmbH, Bruchsal (DE)

( * ) Notice: Subject to any disclaimer, the term of this patent is extended or adjusted under 35 U.S.C. 154(b) by 0 days.

(21) Appl. No.: 13/746,375

(22) Filed: Jan. 22, 2013

(65) Prior Publication Data

US 2013/0181613 A1 Jul. 18, 2013

Related U.S. Application Data

(63) Continuation of application No. PCT/EP2011/063040, filed on Jul. 28, 2011.

(30) Foreign Application Priority Data

Jul. 30, 2010 (EP) .................................... 10171461
Dec. 23, 2010 (EP) .................................... 10196902

(51) Int. Cl.
G01J 5/02 (2006.01)
H01J 40/14 (2006.01)
H05B 33/08 (2006.01)
H05B 37/02 (2006.01)
G01S 7/48 (2006.01)

(52) U.S. Cl.
USPC ......... 250/205; 250/214 C; 250/221; 315/151

(58) Field of Classification Search
USPC ........ 250/214 C, 214 B, 214 AL, 214 R, 205, 250/221, 222.1, 206.1, 206.2; 215/151; 345/166, 175; 315/151
See application file for complete search history.

(56) References Cited

U.S. PATENT DOCUMENTS 3,907,440 A * 9/1975 Eichenberger et al. ....... 356/429
4,778,986 A * 10/1988 Lundberg et al. ......... 250/223 R (Continued)

FOREIGN PATENT DOCUMENTS

DE 100 01 955 A1 7/2001
EP 0 706 648 B1 4/1996
EP 1 671 160 B1 5/2007

OTHER PUBLICATIONS

International Patent Application PCT/EP2011/063040 English-language Translation of International Preliminary Report on Patentability mailed Feb. 14, 2013.

(Continued)

Primary Examiner — John Lee
(74) Attorney, Agent, or Firm — Woodard, Emhardt, Moriarty, McNett & Henry LLP

(57) ABSTRACT

An opto-electronic measuring arrangement being independent from extraneous light includes a transmission light source and a compensation light source which sequentially emit light on a clocked phase basis. The emitted light is respectively phase-shifted. The light sources can be controlled such that the clock-synchronous signal difference between different phases becomes zero. A basic coupling light source transmits light directly to the optical receiver without the light being influenced by the measuring object. The basic coupling control current is so that a desired sensitivity of the measuring arrangement is achieved and/or a desired operating point can be set. The controllable current source for generating a clocked transmission control current and the controllable basic coupling current source for generating a clocked basic coupling control current are phase-synchronously clocked. The controllable compensation current source for generating a clocked compensation control current is clocked with the inverted clock signal of the clock generator.

19 Claims, 8 Drawing Sheets

(56) References Cited

U.S. PATENT DOCUMENTS

| | | | |
|---|---|---|---|
| 5,532,472 A * | 7/1996 | Furuta | 250/214 B |
| 5,666,037 A | 9/1997 | Reime | |
| 5,763,873 A * | 6/1998 | Beck et al. | 250/214 B |
| 6,828,546 B2 * | 12/2004 | Reime | 250/221 |
| 6,927,384 B2 * | 8/2005 | Reime et al. | 250/221 |
| 6,953,926 B2 * | 10/2005 | Reime | 250/221 |
| 6,965,327 B2 * | 11/2005 | Reime | 341/31 |
| 7,486,386 B1 * | 2/2009 | Holcombe et al. | 356/4.01 |
| 7,589,303 B2 | 9/2009 | Reime et al. | |
| 8,125,619 B2 * | 2/2012 | Chang et al. | 356/4.01 |
| 8,274,037 B2 * | 9/2012 | Ritter et al. | 250/214.1 |
| 8,530,819 B2 * | 9/2013 | Ritter et al. | 250/214 A |
| 2011/0295505 A1 * | 12/2011 | Melcher et al. | 702/3 |
| 2012/0268727 A1 * | 10/2012 | Schrey et al. | 356/5.01 |
| 2013/0181613 A1 * | 7/2013 | Schweninger | 315/151 |

OTHER PUBLICATIONS

International Patent Application PCT/EP2011/063040 (published as WO 2012/013757 A1) International Search Report mailed Sep. 13, 2011.

\* cited by examiner

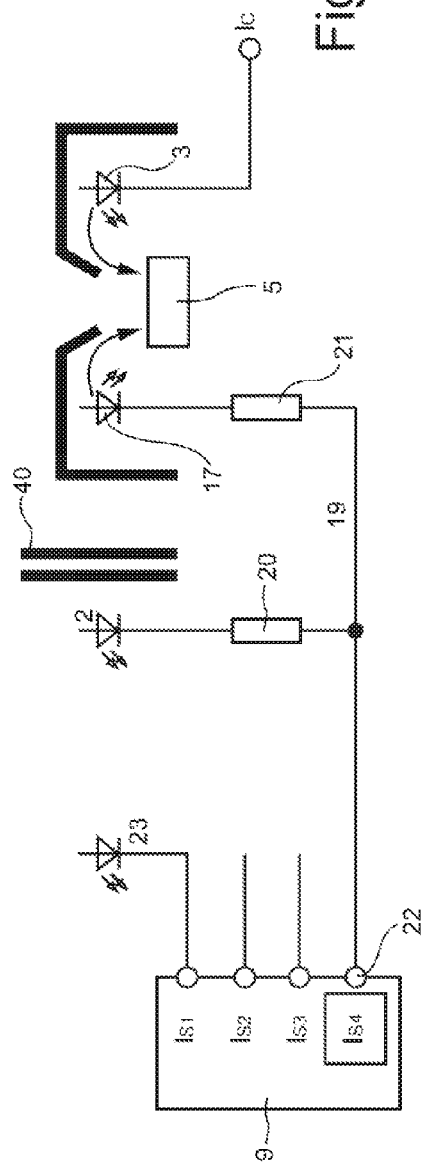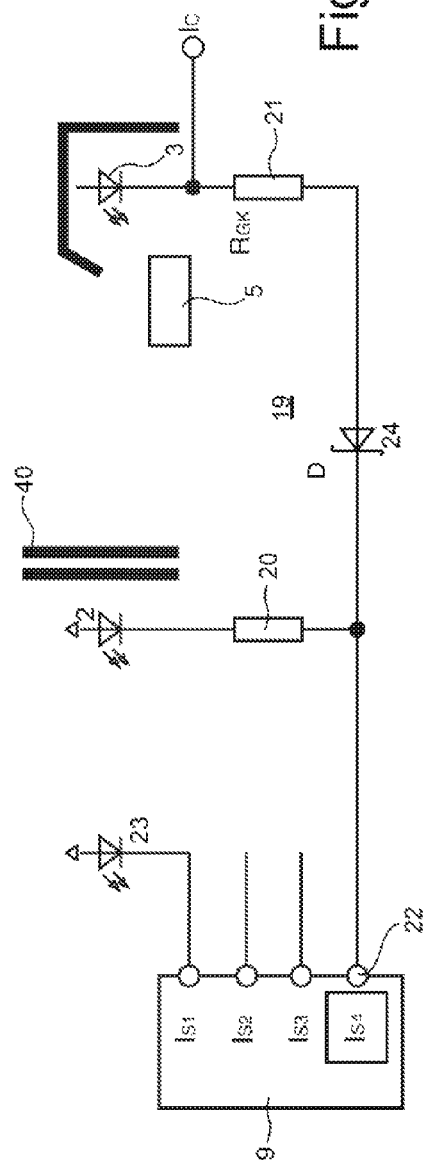

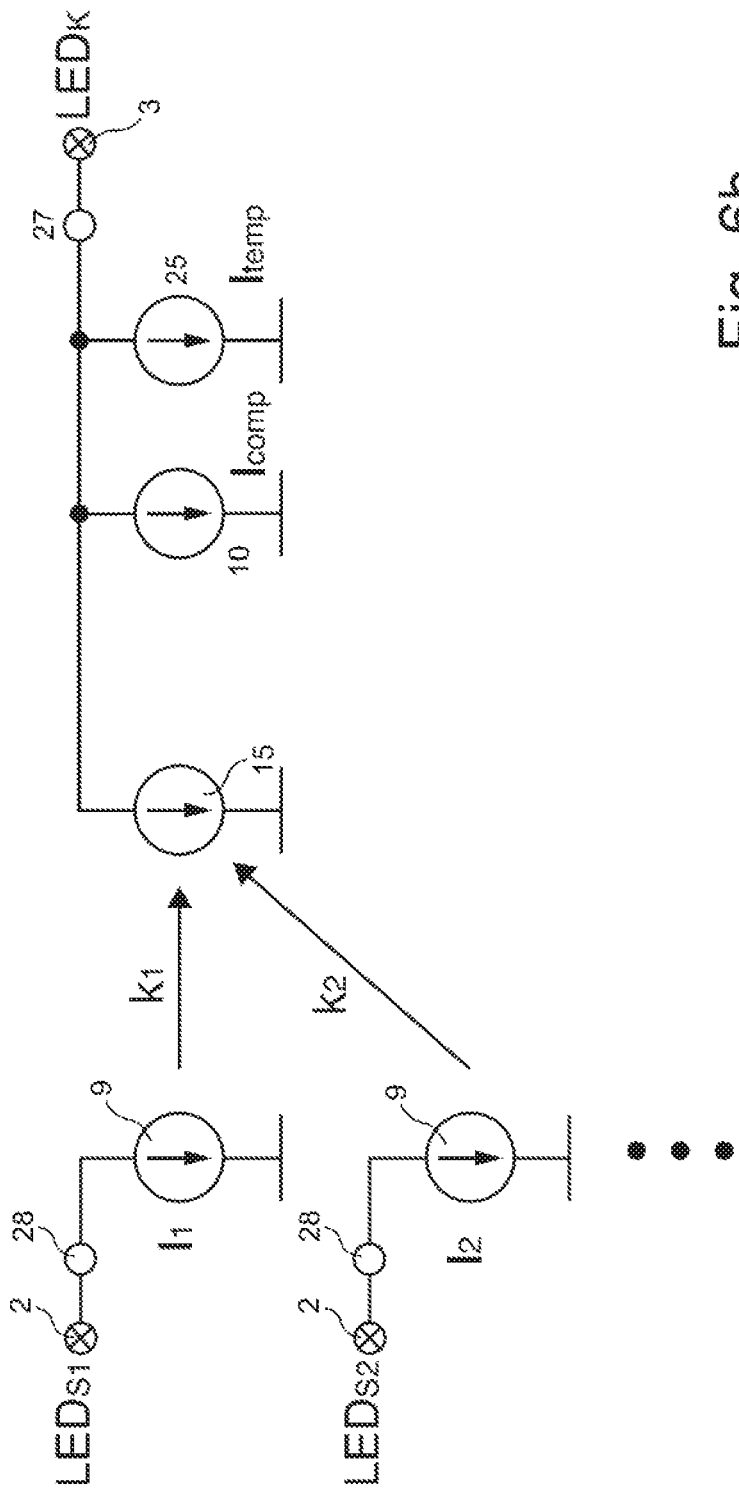

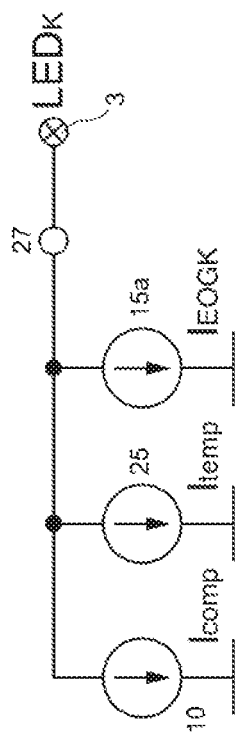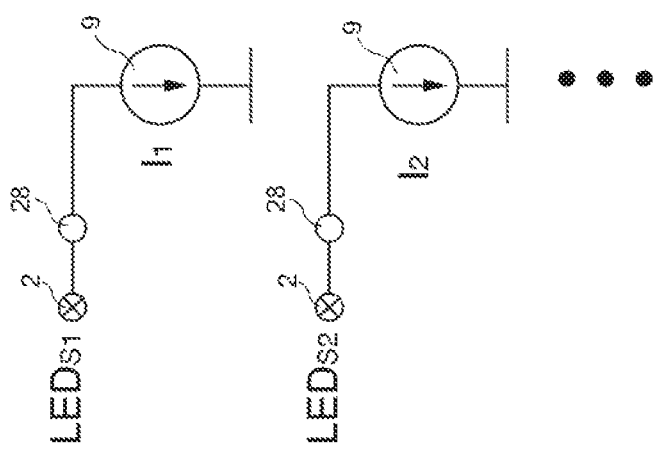
Fig. 6c

OPTO-ELECTRONIC MEASURING ARRANGEMENT WITH ELECTRO-OPTICAL BASIC COUPLING

CROSS-REFERENCE TO RELATED APPLICATION

This application is a continuation of International Application No. PCT/EP2011/063040, filed Jul. 28, 2011, which claims the benefit of European Patent Application No. 10171461.6 filed Jul. 30, 2010 and which also claims the benefit of European Patent Application No. 10196902.0 filed Dec. 23, 2010, which are hereby incorporated by reference in their entirety.

BACKGROUND

The present invention relates to an opto-electronic measuring arrangement having the features of the preamble of claim 1.

An opto-electronic measuring arrangement of such kind functions according to the HALIOS® principle developed by ELMOS AG with a (purely) optical transmitter basic coupling. This measuring principle is known in the related art and is described in various documents including U.S. Pat. No. 5,666,037; EP 0 706 648 B1; EP 1 671 160 B1; DE 100 01 955 A1.

The measuring arrangement, hereafter referred to as the "sensor", comprises a compensation light source, hereafter referred to as the "compensator" as well as a transmission light source, hereafter referred to as the "transmitter". Both light sources are alternately energized by a separate, dedicated current driver to transmit light (normally in the IR spectrum) in the transmission phase or compensation phase respectively. For this purpose, a clock generator controls the current drivers with clock signals that are phase-shifted by 180° with respect to one another. The frequency may be in the range from a few to several hundred kHz.

Via a photodiode, an optical receiver receives a portion of the light that is emitted by both light sources and converts it into current alternating signals. After separation of direct current and low frequency signal components (generally originating from ambient light) the current alternating signals are forwarded through a high-pass function (a capacitor for example) to a transimpedance amplifier (TIA), which converts these current signals into voltages. In turn, these voltages are then assigned alternatingly to the transmission phase and compensation phase in a synchronous demodulator and forwarded to a control unit. The control unit has the function to equalize the amplitude of these two signal components. To do this, the control unit adjusts the amplitudes of the currents through the compensator and the transmitter as necessary. Depending on the application, it is also possible to adjust only the amplitude of the compensator current with constant transmitter current amplitude or vice versa only the amplitude of the transmitter current with constant compensator current amplitude. The amplitudes of the compensator current are usually in the range of a very few mA. Depending on the application, the transmitter current amplitudes may be in the range from a few mA to several hundred mA.

The light emitted by the transmitter into the area surrounding the sensor impinges on the object that is to be measured (to be detected) outside of the sensor. This object reflects a fraction of the impinging light back to the photodiode of the sensor. The ratio between the current received by the photodiode and the transmission current used therefor is the coupling factor of the transmitter-measurement object-photodiode path, which the sensor determines and reflects in its controller correction signal.

Another (usually smaller) fraction of the transmission light reaches the photodiode within the sensor, and thus independently of the measurement object. This is the fraction of light that corresponds to the (internal) optical coupling factor of the transmitter-photodiode path (hereafter referred to as the optical basic coupling "OBC"). This is a (purely) optical coupling factor, since it depends entirely on geometric parameters (distances, angles) and material properties of the optical path (reflection or attenuation) within the sensor. In mathematical terms, the optical basic coupling is the ratio between the current generated by the transmission light in the photodiode without a measurement object and the transmission current used therefor. Accordingly, only the fraction of the transmission light that is transferred to the photodiode via the light path located in the sensor is considered.

The optical basic coupling is constant and in most cases is defined primarily by the sensor cover. For example, if an LED is used as the transmitter and an LED transmission current of 50 mA generates a photodiode current of 50 nA, the value of the optical basic coupling OBC in this case is 1:1000000, or expressed otherwise, $1 \times 10^{-6}$.

The compensator is designed so that the emitted light is (practically) unable to reach the measurement object but instead is guided to the photodiode inside the sensor. In practical application, the light component emitted by the compensator is set to a predefined value, so that only a certain (usually small) fraction of the radiated light impinges on the photodiode of the sensor during the compensation phase. The optical coupling factor of the compensator photodiode path is the ratio between the current generated in the photodiode from this light component and the compensation current used therefor. The coupling factor is constant. Since light emitted by the compensator essentially does not reach the measurement object, it thus represents an immutable value or reference for the measurement. For example, if an LED is used as the compensator and the LED compensator current of 1 mA generates a photodiode current of 50 nA, the value of the compensator coupling in this case is 1:20000, or expressed otherwise, $50 \times 10^{-6}$.

Since both the light originating from the transmitter and from the compensator travels along the entire receiver path including the photodiode, both signal components are influenced to the same degree by the transmission characteristics of the entire receiver path. The receiver path includes the high pass and the transimpedance amplifier as well as the photodiode. In mathematical terms, the transmission function of the entire receiver is canceled out in the system equations, and with it all relevant interfering dependencies such as the light sensitivity or temperature dependency of the photodiode. This explains, among other phenomena, the high degree of independence from extraneous light of the HALIOS® measuring method. The sensor remains functional even in full sunlight (100 klx). Even under these adverse ambient light conditions, it is entirely capable of reliably detecting an object within a defined measurement range. Movements of this object may also be detected. Thus for example it is possible to distinguish the approach of a hand or a wiping motion thereof in different directions. Touches of the sensor with a finger (tapping) may also be interpreted as switching functions. When equipped with a powerful optics system, a sensor that works according to the HALIOS® principle is able to detect an object, an item of luggage on a conveyor belt, for example, even at a considerable distance, for example 5 m or 10 m.

The optical transmitter basic coupling (OBC) determines the control unit resting value for the entire measuring arrangement. If no measurement object is in the vicinity of the sensor, no light is reflected outside of the sensor to the photodiode during the transmission phase. The sensor system is only adjusted to the optical basic coupling (OBC). It is decisive in influencing a whole range of properties of the sensor: for example, the optical basic coupling defines the sensor's sensitivity. If the optical basic coupling of the sensor is high, only a relatively small part of the light emitted by the transmitter is modified by the measurement object. Consequently, the sensitivity of the sensor is correspondingly low. This is equivalent to a small measuring range of the sensor. Conversely, a small optical basic coupling indicates high sensor sensitivity, which in turn enlarges the measurement range of the sensor. At the same time, a small optical basic coupling value also means that the resting value is more affected by noise, since the sensor system must function with little, or less, energy because the energy-rich signal component of the (missing) measurement object is entirely absent from this operating point. Noisy signals slow down the adjustment process, which in turn results in a slower response time of the sensor if the measurement object is moving away from the sensor.

The optical basic coupling is thus an important parameter in any sensor that works according to the HALIOS® principle, and it must therefore be tuned very precisely. With the measuring arrangements known from the related art, the settings for the optical basic coupling are made exclusively by means of structural features and changes to the sensor. The adjustment of the sensor is therefore very delicate and can only be made for a fixed value. Particularly with measuring arrangements (sensors) that include multiple transmitters positioned at different distances from the photodiode, a defined, dedicated optical basic coupling with the photodiode is needed for each transmitter. The opto-mechanical problem that must be solved in order to do this is usually very complex and makes production and particularly the design of the sensor very expensive.

Accordingly, based on the existing related art, an object of producing an improved opto-electronic measuring arrangement presents itself. Such an arrangement should particularly offer the capability of simpler, optimized setting of the optical basic coupling.

SUMMARY

The present object is solved with an opto-electronic measuring arrangement having the features of claim 1.

The opto-electronic measuring arrangement according to the invention is used particularly for capturing the position and/or movement of an object. The measuring arrangement comprises a transmission light source and a compensation light source, each of which sequentially emits light on a clocked phase basis. The light emitted by the sources is respectively phase-shifted. The measuring arrangement comprises an optical receiver with a photodiode for receiving light that contains a clock synchronous measurement signal transmitted by the light sources. The optical receiver also has an amplifier unit for amplifying a current generated in the photodiode on the basis of the received measurement signal. A clock generator generates a clock signal. The clock signal is fed to a controllable current source for generating a clocked transmission control current for the transmission light source and feeds a controllable compensation current source for generating a clocked compensation control current for the compensation light source. The compensation current source is supplied with the inverted clock signal. The demodulator of the measuring arrangement is used for clock synchronous evaluation of the measurement signal current that is received by the photodiode and amplified and converted into a corresponding voltage signal by the transimpedance amplifier.

The control unit generates at least one control signal for the controllable current source and/or compensation current source. The control unit is configured and constructed in such a way that the light intensity with respect to the amplitude of the compensation light source and/or of the transmission light source can be controlled by controlling the corresponding control current (compensation control current or transmission control current), such that the clock-synchronous signal difference occurring between different phases becomes zero.

According to the invention, the opto-electronic measuring arrangement also comprises a further current source (generally even for each transmitter in the sensor), hereafter referred to as the "basic coupling current source", which functions clock- and phase-synchronously with the transmitter current driver, that is to say the basic coupling current source generates a current pulse at precisely the same time as the transmitter current driver generates a pulse. The controllable basic coupling current source thus generates a clocked basic coupling control current. The basic coupling current source is also clocked via the clock signal from the clock generator, in fact with the same clock as the transmission light source.

In a first variant of the embodiment, the basic coupling control current is preferably passed through a light source that is provided especially for that purpose (basic coupling light source), and which radiates the required light quantity to the photodiode exclusively in the interior of the sensor. The basic coupling light source does not have a light component that leaves the measuring arrangement and exits to the exterior (outside the measuring arrangement). Consequently, no light from the basic coupling light source reaches the measurement object.

Accordingly, the basic coupling light source is fully or also only partly responsible for generating the necessary optical basic coupling OBC of a measuring arrangement known in the related art. The great advantages of this are that there are very few constraints on the positioning of this light source (that is to say it can be positioned independently of the transmitter), that it offers the capability of a distinct, individually adjustable optical coupling with the photodiode, and that the current strength thereof can be set individually (easily and quickly), and in particular in a preferred IC variant may even be reconfigured as required. Such reconfiguration thus takes place solely by electronic means. Thus, the option of an electronically adjustable optical basic coupling (also referred to hereafter as "EOBCEOBC") is created.

The basic coupling control current is adjusted such that the measuring arrangement has a desired sensitivity, which is also determined primarily via the setting of the resting value. In addition, the stability of the control and the dynamics (dynamic range and behavior) of the control unit may be influenced specifically as an optional or additional feature. For this, the transmission light source and/or the compensation light source is adjusted via the control unit in the absence of an object to be detected in such manner that the received measurement signal emitted by the basic coupling light source is compensated by the compensator signal. The compensation is carried out in such manner that the phase-offset signals, which are measured alternately at the optical receiver in both measurement phases, are identical at each compensated operating point. Accordingly, the basic coupling light source is compensated in such manner that the resting value desired or required for the intended application of the measuring arrangement may be set. The basic coupling control current thus serves to define this important operating point.

The basic coupling is defined as the reflected fraction of the light emitted by the transmitter light source without reflection of the (measurement signal) light by an object that is to be detected. The basic coupling is the component of the light source that is guided or radiated to the photodiode exclusively inside the measuring arrangement (with or without reflection inside the measuring arrangement).

In the related art, the desired or necessary optical basic coupling is usually set via opto-mechanical structural features. Particularly when a plurality of transmission light sources are present in the sensor (measuring arrangement), this is often very complicated. Dirt, moisture or scratches on the sensor surface can also noticeably impair the optical basic coupling.

In the context of the invention, it was discovered that an optical coupling consisting of two portions exists between the transmission light source and the photodiode. The first portion of the optical coupling is the functional, object coupling portion, which is to be determined by the measuring arrangement. This portion thus represents the portion of the light that is reflected by the measurement object outside of the measuring arrangement. If there is no object in the vicinity of the measuring arrangement, this portion of the light received by the photodiode is equal to zero. The second portion is the optical basic coupling of the transmitter. This portion is based on the illumination of the photodiode via the optical path between the transmitter and the photodiode solely inside the sensor. The basic coupling must be defined very precisely because it affects the optical measuring arrangement in several ways. Firstly, the basic coupling of the transmission light source is precisely the measurement variable with which the control unit works while no measurement object is present. Consequently, the basic coupling particularly determines the resting value of the measurement arrangement.

In addition, the sensitivity of the measuring arrangement and therewith also the range of the sensor is affected by setting the basic coupling. By adjusting the sensitivity, which also changes the basic coupling, it is possible to define the maximum distance at which an object may still be detected by the measuring arrangement.

Another way in which the basic coupling influences the measuring arrangement is that it contributes to the noise power in the measuring arrangement and the associated settling time of the sensor signal. Consequently, the basic coupling also affects the speed with which measurement objects can be detected.

In the context of the invention, it was realized that since the optical basic coupling of the measuring arrangement in many application cases is low or too low, or also that it can be considerably lowered in targeted manner, to that point that it is preferably almost negligible, it thus becomes possible to generate the necessary, or missing, coupling value by electro-optical means. The basic coupling light source is preferably shielded to some degree by mechano-optical means, such that the emitted light reaches the photodiode with the right intensity. The setting is made without a light component reflected from a measurement object. The electro-optical basic coupling is then easy to adjust within acceptable limits via suitable (electronic) control of the basic coupling source. The desired resting point (operating point) of the measuring arrangement may then be set very easily.

In this way, existing measuring arrangements of the related art may be improved advantageously. In this way, the basic coupling may be generated particularly for measuring arrangements in which at least one of the transmission light sources is located at a great distance from the photodiode. The electrical generation of the optical basic coupling may be adapted individually for any transmission light source. Thus, any of the individual control loops with their respective transmission light sources may be individually supplied with the requisite basic coupling values.

When an optical basic coupling (EOBC) generated electrically by a basic coupling light source EOBC is used, the considerable constructive effort associated with having to set the optical basic coupling of the transmission light source solely by mechano-optical means is no longer a factor. Accordingly, the development and manufacture of such measuring arrangements is rendered significantly simpler and less expensive. Development can be carried out more quickly. This is currently the only approach in existence that specifically enables the use of multiple transmission light sources, some of which are located at substantial distances from the optical receiver. Consequently, user acceptance for measuring arrangements that are based on this measuring method is increased. The measuring arrangement according to the invention thus overcomes a number of significant drawbacks of the related art.

In the context of the invention, it was realized that the basic coupling light source may be the compensation light source. In a second preferred embodiment, therefore, the compensator (that is to say the compensation light source) is used both for compensation and for generating the light component that corresponds to the EOBCEOBC. For this, the current of the compensations current driver and the current of the basic coupling current source must be merged (added together), which may be accomplished simply with electronic means. In this case, the compensation current flows through the compensator during the compensation phase and, according to the invention, the current from the basic coupling current source also flows through the compensator during the transmission phase. In this way, the compensation light source is used for two purposes; in this second embodied variant, an additional light source for generating the EOBCEOBC is no longer necessary.

A sensor that is equipped with the EOBCEOBC is preferably configured with the smallest possible (purely) optical basic coupling (ideally zero), so that the largest possible fraction of the basic coupling required by the application may be generated by electro-optical means. This situation yields the best flexibility (configurability) while retaining the highest stability, since the (purely) optical basic coupling component is subject to various interference factors, which are generally not insignificant. The second embodied variant features particularly good resistance with regard to many interference factors. In the least favorable operating point, the resting state, in other words when no measurement object is present and no optical reflection reaches the photodiode, the entire measuring arrangement must function with the lowest signal power. Then, in order to generate the resting output signal the controller only adjusts the relatively low photodiode current of the EOBCEOBC with the photodiode current generated by the compensator. According to the invention, both optical signal components are generated in the same electro-optical component, the compensation light source, and consequently are equally exposed to the interference factors associated with this component. Such factors are primarily the unfavorable temperature coefficient of the light yield from the IR LEDs, which is about −0.5%/K.

Surprisingly, it was also found that existing measuring arrangements, known in the prior art can be significantly improved without excessive effort, simply by equipping them with an additional current source.

In a preferred embodiment of the opto-electronic measuring arrangement, the basic coupling current that passes through the compensation light source is set to not more than 50%, 20% or 10%, or in the case of sensors with a longer range to considerably lower percentages of the transmission control current. In such cases, the (purely) optical basic coupling is preferably as small as possible compared with the functional object coupling (not more than 5% or 2% or 1% of this value), particularly preferably close to zero. The electro-optical basic coupling (EOBCEOBC) that is generated by adjusting the basic coupling control current of the basic coupling source supplements or replaces the low or nonexistent optical basic coupling of the transmission light source.

In a preferred embodiment, a measuring arrangement comprises a plurality of transmission light sources, which are compensated by the compensation light source sequentially, one after the other in a control loop. For this, the controller carries out a compensation with the compensation light source for each of the transmission light sources. An optimized, adapted basic coupling control current is generated for each of these control loops. The controllable compensation control source is controlled via the basic coupling control current. In this way, an individual electro-optical basic coupling may be generated for each individual transmission light source.

In practice, it is usual with opto-electronic measuring arrangements for the control units, demodulators, clock generators and amplifiers to be integrated in a chip. This integrated electrical or electronic component preferably also contains the signal transmitters for the controllable current sources. The current sources, particularly the controllable transmission light current source and the basic coupling current source, are controlled by one or more signal transmitters. Integrating the signal transmitters, particularly the signal transmitter for controlling the basic coupling current source, does not entail significant additional (hardware) costs in the implementation of the opto-electronic measuring arrangement. Only the development of the chip involves additional one-time effort. To this extent, the addition according to the invention of the electro-optical basic coupling feature in the opto-electronic measuring arrangement is extremely cost-effective.

The measuring arrangement according to the invention has many advantages. The provision of optical basic coupling by electrical means results in significantly reduced effort of the optical design (optics design) of the measuring arrangement. Of the three technical criteria that originally had to be satisfied previously by the optics, namely the best possible transmission, the best possible reception, and the generation of a corresponding optical basic coupling, only two now have to be satisfied at the same time. This results in considerably less stringent requirements being imposed on the opto-mechanical design of the measuring arrangement, particularly the constructive layout. Since there is no longer a requirement for an optical basic coupling from the transmission light source to the optical receiver, the often critical basic coupling paths of the existing sensors may practically be circumvented. These optical basic coupling paths are often subject to significant interference factors. For example, in many cases component tolerances and installation tolerances, material influences and surface properties can significantly affect the basic coupling of the related art. External influences such as moisture, dirt or scratches on the front plates are even more critical. These factors become much less significant when the electro-optical basic coupling is used. Furthermore, their design required a high level of specialized technical knowledge regarding the basic coupling and the optical beam paths within the sensor. With the measuring arrangement according to the invention, even highly complex applications are much more easily manageable, generally with less specialized expertise. The invention thus offers great commercial benefit.

It has been revealed that the measuring arrangement with electro-optical basic coupling according to the invention also enables simpler circuit board layout. The layout of the circuit is determined largely by the optical and mechanical requirements. However, these are now considerably simplified. The measuring arrangement according to the invention also enables the optimal basic coupling to be created exactly by electronic means. This is easy to do for any transmission light source and for the control loop based thereon. Consequently, optimal noise values and settling time for a predefined radiated power are also obtained. The measuring arrangement works faster and more accurately.

The measuring arrangement also has advantageous thermal behavior, because only one light source or LED, that is to say preferably the compensation light source is included in the basic coupling and in the definition of the resting value as the fundamental operating point.

The reduction or elimination of the (purely) optical basic coupling from the transmission light source to the photodiode allows a simpler structural design. Combining this simplified design with the faster, more effective adjustment capability of the electro-optical basic coupling results in shorter development times. Whereas previously for example waveguides had to be laboriously simulated and created to enable testing with the electro-optical basic coupling method the current for the basic coupling light source may be modified for example by replacing a resistor and the sensor may be returned very quickly.

A further advantage of the arrangement is offered by the free configurability of the same (physical) control loop to solve various tasks with the measuring arrangement sequentially, for example with time division multiplexing. Thus for example proximity measurements may be carried out at a longer distance (between 20 and 70 cm for example) in one cycle of a control loop, while in the next control loop the contact of a sensor surface is recognized (touch detection). This renders the system highly flexible, since it is possible to adapt (reconfigure) the basic coupling for each control cycle by electro-optical means while the device is operating. The measuring arrangement according to the invention is thus extremely flexible and versatile. It is highly stable, so that the operating point is precisely adjustable. For example, the sensitivity of the sensor may be increased by targeted tuning of the operating point, and on the other hand the robustness of the control may also be optimized.

BRIEF DESCRIPTION OF THE DRAWINGS

The invention will hereafter be explained in greater detail with reference to the particular embodiments represented in the drawing. The special features represented therein may be implemented alone or in combination to create preferred configurations of the invention. The embodiments described do not represent a limitation of the invention defined in its generality by the claims. In the drawing:

FIG. 4 is a schematic diagram of an embodiment of the EOBCEOBC according to the measuring arrangement in FIG. 2;

FIG. 5 is a schematic diagram of an embodiment of the EOBCEOBC according to the measuring arrangement in FIG. 3;

DETAILED DESCRIPTION

Figure 1:
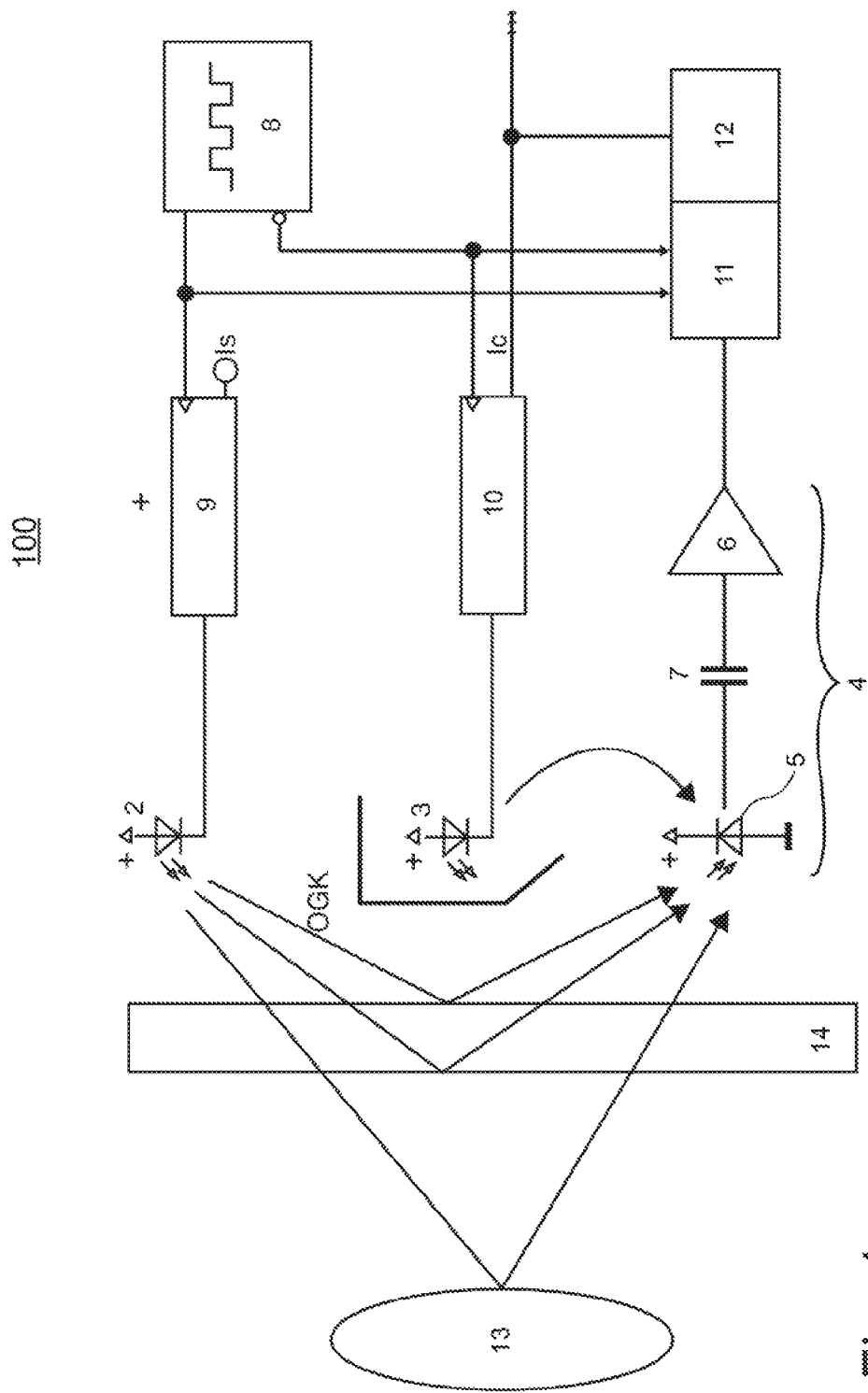
FIG. 1 is a schematic diagram of a measuring arrangement of the related art (according to the HALIOS® measuring method)

FIG. 1 shows a measuring arrangement 100 according to the related art. Measuring arrangement 100 comprises a transmission light source 2, a compensation light source 3, and an optical receiver 4 that includes a photodiode 5 and an amplifier unit 6. Amplifier unit 6 is in the form of a transimpedance amplifier, wherein at least one capacitor 7 is connected between transimpedance amplifier 6 and photodiode 5. In the design variant of the coupling of photodiode 5 for enhanced EMC performance, two capacitors 7 are provided at this location.

A clock generator 8 clocks a controllable current source 9, which supplies transmission light source 2. Clock generator 8 also returns an inverted clock signal to a controllable compensation current source 10, which supplies compensation light source 3. Both the clock signal and the inverted clock signal from clock generator 8 are fed to a demodulator 11 for clock synchronous evaluation of the currents or voltages generated by optical receiver 4 on the basis of the received light signals.

A controller unit 12 of measuring arrangement 100 generates a control signal for controllable compensation current source 10, such that compensation light source 3 may be controlled. The compensation light source 3 may be controlled in such manner that the amplitude of the light portions is the same, wherein the light portions are based on the signals received in both phases from the transmission light source 2 and from the compensation light source 3. The transmission current source may also be included in the adjustment process, in which case it is adjusted in the opposite direction to the compensation current source.

If a measurement object 13 is located close to measuring arrangement 100, light emitted by transmission light source 2 is reflected by measurement object 13 towards photodiode 5. At the same time as this signal portion, photodiode 5 also receives the light from the optical basic coupling (OBC) transmitted by transmission light source 2. Photodiode 5 receives the light portion emitted by compensation light source 3 as a further component.

Accordingly, the following correction condition results for adjusting measuring arrangement 100:

$$\frac{I_c}{I_s} = \frac{\eta_s}{\eta_c} \cdot \frac{D_{SG} + D_{SF}}{D_c} \quad \text{(Equation 1)}$$

$I_c$ and $I_s$ are the control signals or control currents for controllable current source 9 of transmission light source 2 and for controllable compensation current source 10 of compensation light source 3. $\eta_s$ or $\eta_c$ is the efficiency of transmission light source 2 and compensation light source 3 respectively. $D_{SG}$ is the optical basic coupling between transmission light source 2 and photodiode 5. $D_{SF}$ is the functional, variable optical coupling between transmission light source 2 and photodiode 5 via measurement object 13, while $D_c$ represents the constant optical coupling between compensation light source 3 and photodiode 5.

In the related art, the optical basic coupling ($D_{SG}$) is set to the desired value by means of a suitable construction or opto-functional design of measuring arrangement 100. Component $D_{SF}$ is the target portion, which contains the information about measurement object 13.

The ratio between the efficiency indices of transmission light source 2 and compensation light source 3 is normally sufficiently well defined and constant in a first approximation. Consequently, this ratio may be calculated according to equation 1. Control signal $I_s$ for controllable current source 9 of transmission light source 2 is known, in certain cases it may even be constant. The control current $I_c$ for compensation current source 10 calculated by the controller unit is directly proportional in the adjusted state to target (functional) optical measurement object coupling $D_{SF}$.

If a measurement object 13 is not present, (functional) optical measurement coupling $D_{SF}$ is equal to zero. The operating point calculated by the controller is thus exactly the resting value, corresponding to the optical transmitter basic coupling.

One drawback in the related art is that the optical basic coupling must be set by (purely) structural measures on measuring arrangement 1. For example, an existing sensor cover 14, which may be semi-transparent, may receive a coating in certain areas thereof to achieve a desired basic coupling. However, particularly when transmission light sources 2 are relatively distant from photo-diode 5 the basic coupling component is usually small, which means that sometimes the desired resting value cannot be set in the related art. This can only be achieved by improving or increasing the basic coupling through structural measures, which in some cases requires additional effort.

Figure 2:
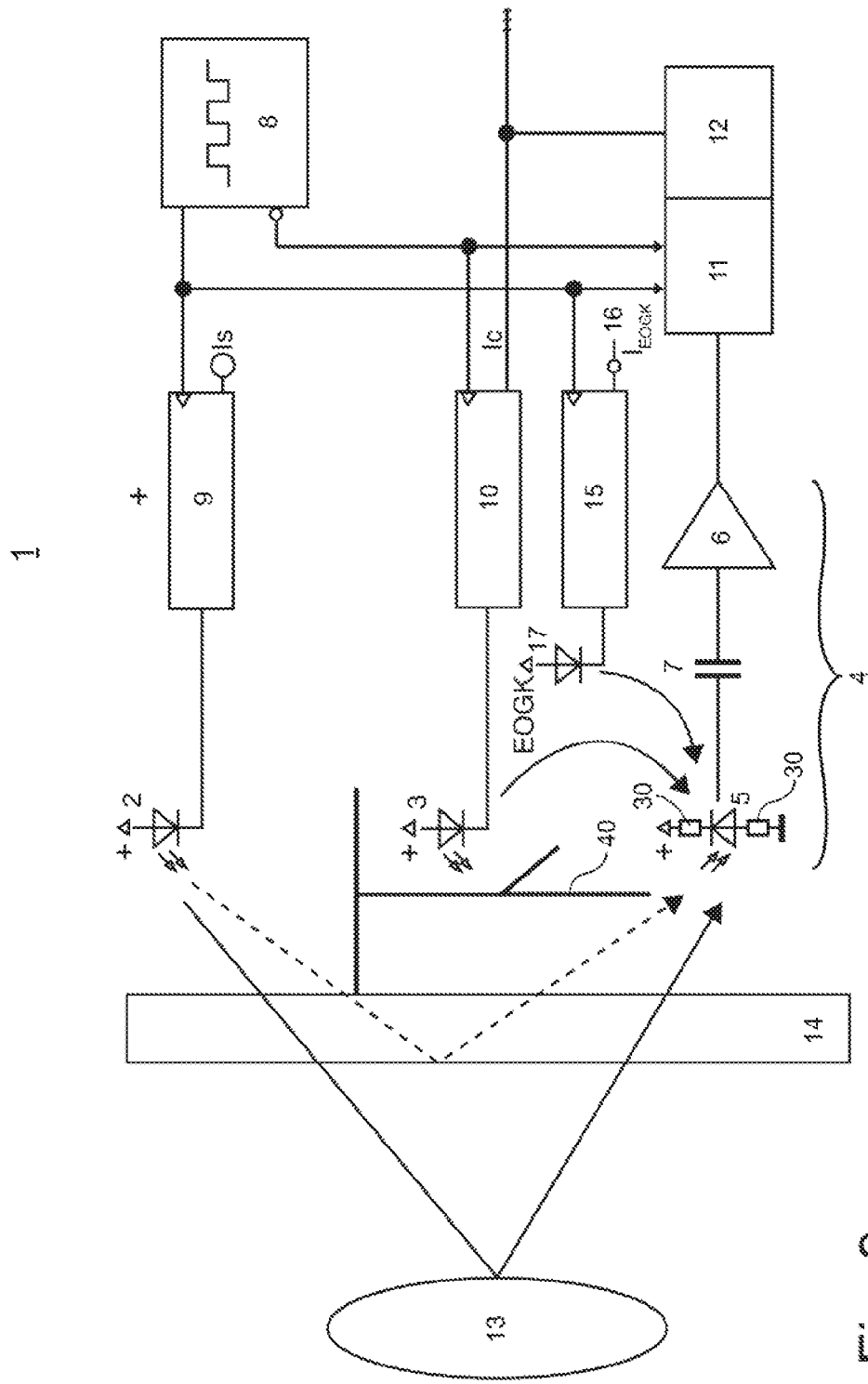
FIG. 2 is a schematic diagram of the measuring arrangement according to the invention in the variant including an additional LED for the EOBCEOBC.

By way of comparison, FIG. 2 shows a measuring arrangement 1 according to the invention, in which the basic coupling of transmission light source 2 is so small that it is not more than 7% or 5% or can be neglected. (The percentages cited here describe the optical basic coupling relative to the values of the functional object coupling). If this is not obtained automatically in the construction, the optical basic coupling may be lowered for example with simple structural measures. For example, an optical shield between transmission light source 2 and photodiode 5 may be created with the simple opto-mechanical screen 40 indicated in FIG. 4, or by positioning the transmission light source sufficiently low in a (narrow) transmission chamber.

Besides controllable current source 9 and controllable compensation current source 10, measuring arrangement 1 according to the invention comprises an additional controllable current source, basic coupling current source 15. This is clocked with the clock signal from clock generator 8. At the same time, it is adjusted by a signal transmitter 16, the basic coupling signal transmitter, or even jointly adjusted with the transmission control current source. The clocked basic coupling control current generated in basic coupling current source 15 is fed to a basic coupling light source 17, which transmits the light to photodiode 5.

Consequently, the (purely) optical basic coupling of transmission light source 2 is replaced or correspondingly supplemented by an electrically generated optical basic coupling (EOBC), which is produced with basic coupling light source 17. The advantage of this electro-optical basic coupling of basic coupling light source 17 is that it is no longer dependent on the transmission light source and the for example optical or spatial conditions thereof. Basic coupling light source 17 may thus be adjusted largely independently and usually optimally. This represents a major advantage of measuring arrangement 1 according to the invention over the known measuring arrangements 100.

In order to further improve the insensibility of the receiving apparatus, particularly of photodiode 5, against extraneous light, current low pass filters are built into the power feed lines to photodiode 5 which conduct the AC components and low-frequency signal components of the photodiode current (caused primarily by extraneous light) away to the supply in order to separate them optimally from the high-frequency measurement signals. In this way, the high-frequency measurement signals may preferably be optimally (EMC-compliant) and differentially coupled in the preferably differential transimpedance amplifier 6 via two high pass filters (in the form of coupling capacitors). The current deep pass filters may preferably be in the form of (active) gyrator circuits, that is to say with transistors or MOSFETs, or with passive components, inductances.

FIG. 2 shows that basic coupling light source 17 is clocked in the same phase as transmission light source 2, that is to say phase-offset by 180 degrees relative to compensation current source 10.

In a preferred embodiment, transmission light source 2, compensation light source 3 and/or basic coupling light source 17 are configured as light emitting diodes (LED).

Figure 3:
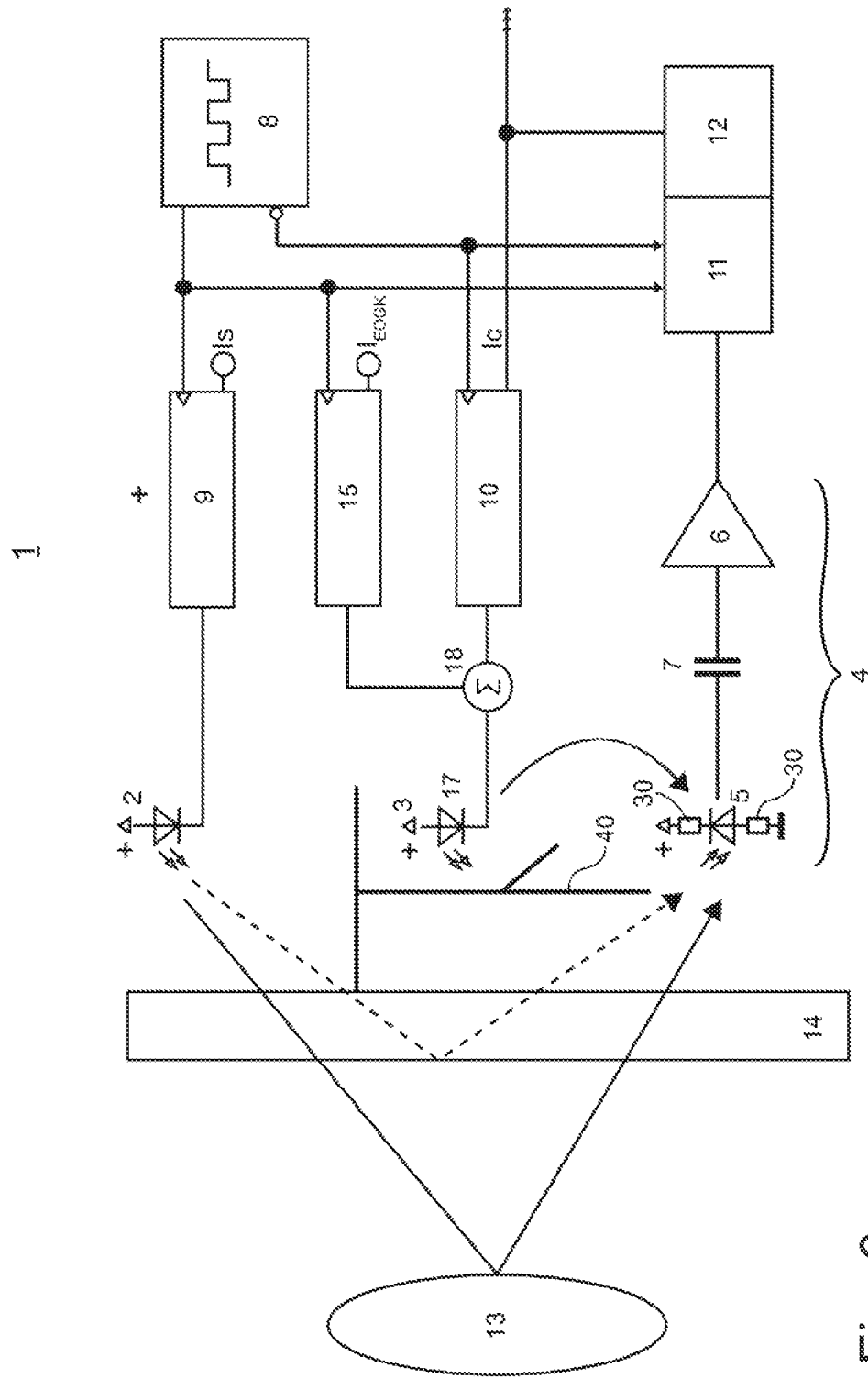
FIG. 3 is a schematic diagram of the measuring arrangement according to the invention in the variant with use of the compensation LED for the EOBCEOBC.

FIG. 3 shows a second, alternative, usually preferred embodiment of measuring arrangement 1 according to the invention, in which basic coupling light source 17 is itself compensation light source 3. Thus, compensation light source 3 also assumes the function of basic coupling light source 17. Controllable basic coupling current source 15 consequently supplies compensation light source 3 just as compensation current source 10 does in the related art. The compensation control current for compensation current source 10 and the basic coupling control current for basic coupling current source 15 are preferably added together in an adder 18 and fed together to compensation light source 3. Since the control currents of basic coupling current source 15 and compensation current source 10 are phase-offset, so that practically a control current composed in the time rage results. The desired electro-optical basic coupling of the measuring arrangement is linked to the compensator coupling, which represents a significant increase in stability for the resting value. It has a great advantage in that the required value is set via the freely available current amplitude of $I_{EOBC}$.

The electro-optical basic coupling is thus ultimately defined by the control signal ($I_{EOBC}$) for controlling basic coupling current source 15. Since this is performed by an electric signal transmitter 16, it is also easy to change the basic coupling later. A different control signal (which can be changed quickly and easily) merely needs to be generated for basic coupling current source 15. Measuring arrangement 1 according to the invention is highly flexible overall and can even be adapted subsequently for other tasks. No structural measures are necessary inside measuring arrangement 1, in particular no additional shielding or coating has to be applied to sensor cover 14 or the cover of measuring arrangement 1. Accordingly, the resting operating point of measuring arrangement 1 may also be changed later to adapt the sensitivity or dynamics or accuracy to new or changed requirements.

It may usually be assumed that the (purely) optical basic coupling (according to the related art) between transmission light source 2 and optical receiver 4 is well below 10%. In practice, the optical basic coupling is not more than 6%, 5% or less. Particularly when transmission light sources 2, are more distant, as is the case for example in relatively expansive constructions and measuring arrangements 1, the optical basic coupling may be as low as 3%, 2% or not more than 1%. In the case of transmission light sources 2 that are located farther away, it is very easy to reduce the basic coupling to 0.5% or less, preferably to 0.1% (of the functional signal) with very little effort and using simple means. The optical basic coupling $D_{SG}$ of transmission light source 2 may thus be disregarded. It is replaced entirely by the electro-optically generated basic coupling $D_{EOBC}$ from basic coupling current source 15. (The percentages cited here describe the optical basic coupling relative to the values of the functional object coupling).

Therefore, assuming that $D_{SG} \ll D_{EOBC}$, it follows from equation 1 stated above that measuring arrangement 1 according to the invention is subject to equation 2:

$$\frac{I_c}{I_s} = \frac{\eta_s}{\eta_c} \cdot \frac{D_{SF} + D_{EOBC}}{D_c}$$

Compensation control current $I_c$ for setting the operating point without a measurement object, that is to say a resting value, is thus only dependent on electro-optical basic coupling $D_{EOBC}$ and accordingly is set using only the basic coupling control current ($I_{EOBC}$). In mathematical terms, in the resting state (operating point=resting value) the (entire) transmission function of the compensation light source is eliminated from the system equations. (Similarly to the situation that already exists on the receiver side in the related art.)

In a preferred embodiment that is not integrated in the IC, the basic coupling current source 15 is not designed in the form of a separate current source. Instead, controllable current source 9 for generating the clocked transmission control current for transmission light source 2 is also used at the same time by passing a usually small fraction of the current through compensator light source 17.

FIG. 4 shows a current splitter 19 that splits the current when an independent (separate) basic coupling light source 17 is used. The transmission control current that is applied to a current driver output 22 ($I_{S4}$) in FIG. 4 is formed via an Ohmic voltage splitter 19 consisting of resistors 20 and 21. The current at current driver output 22, which corresponds to controllable current source 9, is divided between transmission light source 2 and basic coupling light source 17 in the inverse proportion to resistors 20 and 21. In this context, basic coupling light source 17 is responsible for the electro-optically generated basic coupling. This may thus be selected and set independently of compensator coupling $D_C$ of compensation light source 3.

If the diversion of current to generate the EOBC causes the optical output in transmission light source 2 to become unacceptably low, another transmission light source 23 may be connected in parallel with transmission light source 2 and energized synchronously with transmission light source 2.

However, the arrangement according to FIG. 4 has the disadvantage that an additional light source 17 is required. If this is dispensed with and the current splitter resistor transmitted to compensator light source 3, a less expensive configuration is created, corresponding to the schematic diagram of FIG. 3.

Depending on the dimensioning of the current splitter resistors, a low level of positive feedback from transmission light source 2 may arise during the compensation phase. This means that a small or even very small fraction of the compensation current flows through transmission light source 2. In some applications, such positive feedback may even be desirable, for example for forming output characteristic curves. However, if such positive feedback from transmission light source 2 is to be entirely prevented, a circuit arrangement as shown in FIG. 5 is suitable. Diode 24 prevents the current from flowing through the transmission light source into the compensator current source during the compensation phase. Diode 24 is preferably a Schottky diode, so that the current split ratio is disturbed as little as possible due to the small forward voltage of the Schottky diode. However, it is important to be aware that temperature influences may arise as result of using the Schottky diode, particularly if only a low voltage is available to splitting the current. Even so, the advantage of this configuration is that in general no additional basic coupling light source is needed.

The arrangements according to FIGS. 4 and 5 may be considered as a technical intermediate step towards producing basic coupling current source 15 with discrete components while feature EOBC is not yet integrated in a chip. The integration of the EOBC in the chip (for example IC or ASIC) represents the simplest, most flexible, sturdiest, most compact and at the same time most inexpensive solution of the present object.

Integrating the electro-optical basic coupling function in the control chip does not entail additional costs in the realization of this function. This function only has to be integrated once, during development of the chip. In terms of purely hardware-related effort, such as space requirement or temperature stability or similar values and characteristics, the IC solution is optimal. By integrating the electro-optical basic coupling function in the controller chip, it becomes possible to supply basic coupling control currents, which are phase-synchronous with the transmission control currents, to compensation light source 3 or a compensation driver circuit. These currents may be parameterized at will to any value or to a settable proportionality with the transmission control current. In all, such integration renders this function extremely flexible in application.

FIGS. 6a to d show the schematic diagram of controller chip of measuring arrangement 1 in the case that multiple transmission light sources 2 are present. Transmission light sources 2, designated $LED_{S1}$ and $LED_{S2}$, are each connected to a transmission current driver output 28 and are supplied by a controllable current source 9 ($I_1$, $I_2$). The same applies for additional transmission light sources 2 (not shown), which are then designated $LED_{S3}$, $LED_{S4}$, . . . .

The compensation light source 3 required for measuring arrangement 1 according to the invention is also designed in the form of an LED and is designated $LED_K$. It is connected to compensation current driver output 27 of the circuit. A controllable compensation current source 10 for controlling compensation light source 3 is also shown in FIGS. 6a to d.

A further current source for compensating temperature influences is connected in parallel with compensation current source 10. This current source is designated temperature compensation current source 25. It delivers an extra direct current (usually in the order of a very few mA) to the compensation light source preferably only during a control cycle with the purpose of rendering the electro-optical operating point of compensation light source 3, particularly an LED or IR-LED, more comparable with the electro-optical operating point of transmission light source(s) 3 that function with significantly higher currents and power losses (intrinsic heating). This additional direct current is not relevant for the measuring signals, because it is filtered out again by capacitive coupling 7 in the receiver. However, this feature significantly improves the thermal stability of the measuring arrangement.

Figure 6A:
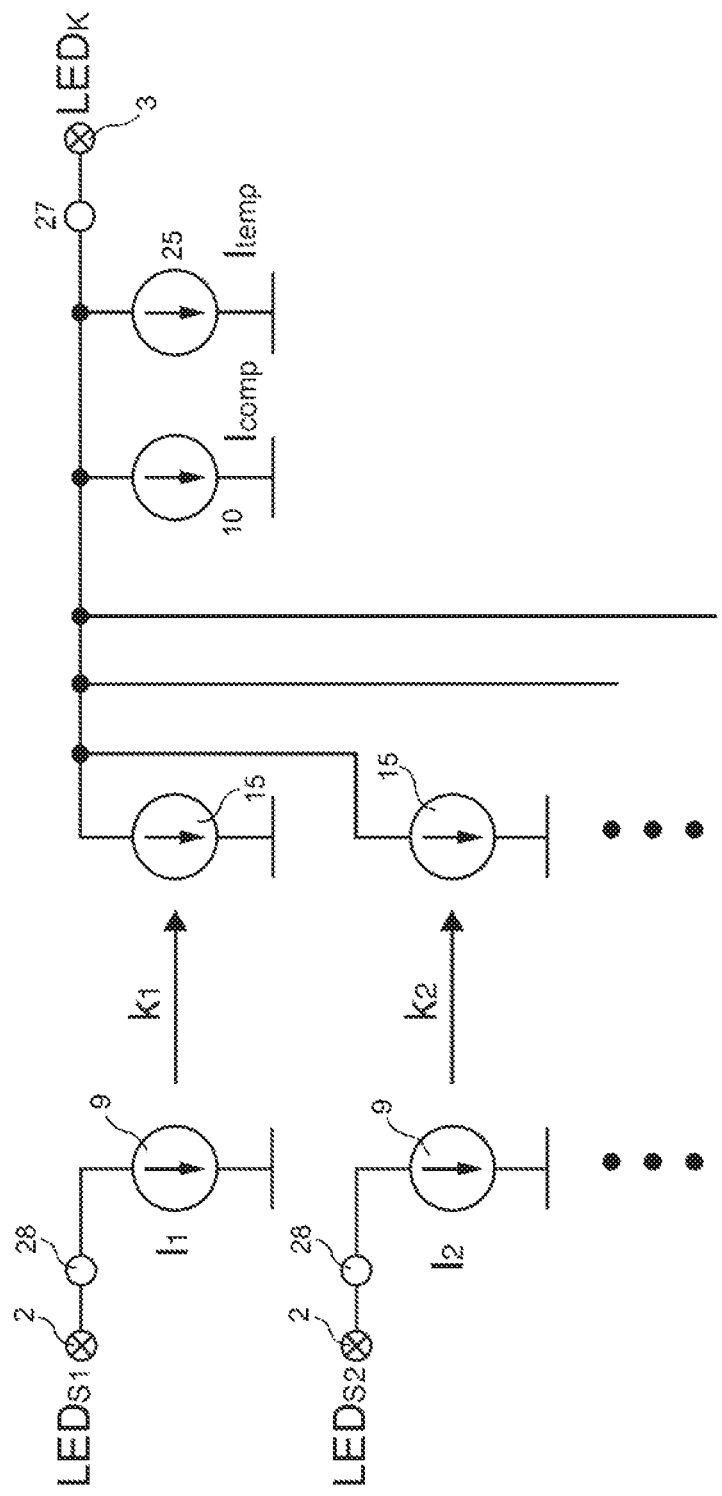
FIG. 6a, b, c, d are further embodiment options of the EOBCEOBC in the IC.

The embodiment of FIG. 6a shows a schematic diagram of the circuit similar to the circuits of FIGS. 4 and 5. Instead of an Ohmic voltage splitter 19 (FIGS. 4, 5), individual basic coupling current sources 15 are used, replacing the respective resistors. The advantage of this is that for each application a simple adaptation of the measuring circuit may be made merely by adjusting the current value in controllable basic coupling current source 15. Each transmission current source 9 of the individual $LED_{S1}$, $LED_{S2}$, . . . has a corresponding basic coupling current source 15. At the same time, a stable, linear relationship is established between the transmission current of the respective transmission current source 15 for the individual $LED_{S1}$, $LED_{S2}$, . . . and the basic coupling current of basic coupling current source 15 for the respective transmission light source ($LED_{S1}$, $LED_{S2}$, . . . ). The advantage of using basic coupling current sources 15 is that factor $k_1$, $k_2$, . . . , which is the basic coupling factor of the respective transmission light source 2, can be parameterized in a very wide range, practically without limits. Factor $k_1$, $k_2$, . . . is usually selected to be less than 1. Of course, it is also possible to select basic coupling factors $k_i$ equal to or greater than 1. The individual basic coupling factors $k_i$ (i=1, 2, . . . ) are preferably different, because they depend on the respective transmission light source 2 and its position in the arrangement.

FIG. 6b shows an alternative embodiment in which the individual basic coupling current sources 15 for individual transmission light source 2 are dispensed with except for a single basic coupling current source 15. This basic coupling current source 15 is processed in a time division multiplexing procedure, and thereby generates a corresponding basic coupling current for each transmission light source 2 by sequentially switching the corresponding control signals to the individual basic coupling current source. In this context, the respective basic coupling current is generated at compensation current driver output 27 sequentially for the transmission light sources. Therefore, a separate basic coupling factor $k_i$ (i=1, 2, . . . ) exists between basic coupling current source 15 and each transmission current source 9 (for $LED_{S1}$, $LED_{S2}$, . . . ).

FIG. 6c shows an embodiment in which the linear relationship between transmission light source 2 and basic coupling current source 15 is eliminated. Instead of the former basic coupling current sources 15, only one basic coupling current source 15a is present, in which the current amplitude may be permanently set. The direct proportionality between the (controlled) transmission current and the basic coupling current has been abandoned. The justification for this simplification is based on the fact that the primary function of the electro-optical basic coupling is to adjust the resting value in a defined manner in the absence of a/the measurement object. In this variant of the EOBC, a fixed current value of basic coupling current source 15 is set individually for the respective light source 2 ($LED_{S1}$, $LED_{S2}$, . . . ) depending on the application, in order to achieve the desired electro-optical basic coupling in each case.

Figure 6D:
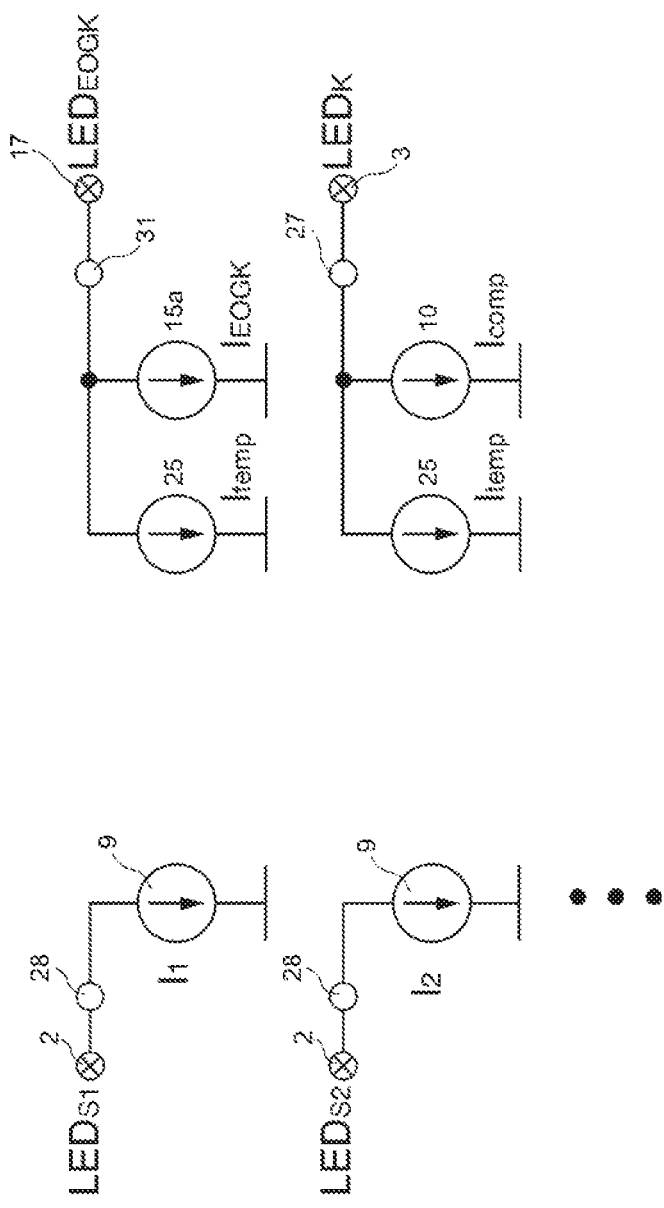

In the embodiments of FIGS. 6a to c, compensation light source 3 is specified by the IC as the respective basic coupling light source 17, since there is only one corresponding current driver output 27. In the most generally applicable IC configuration, as shown in FIG. 6d, a separate basic coupling light source 17 may in turn be used independently of and in addition to compensation light source 3. Basic coupling light source 17 is controlled by basic coupling current source 15a via separate driver output 31. All three dependencies between basic coupling current source 15, 15a and transmission current sources 9 according to the variants shown in FIGS. 6a to c are also possible here. Short circuiting (summing) of driver outputs 27 and 31 results in precisely the situation shown in FIG. 6c. So it is possible to dispense with separate basic coupling light source $LED_{EOBC}$ in this IC variant if necessary.

As illustrated in FIG. 6d, a temperature compensation current source 25 should also be connected in parallel to basic coupling current source 15a in order to compensate or minimize thermal influences. This is necessary because the measurement currents generated by basic coupling current source 15a may occasionally be very small.

The invention claimed is:

1. An opto-electronic measuring arrangement that is largely independent of extraneous light, comprising
   a transmission light source and a compensation light source, which sequentially emit clocked phased light, wherein the light emitted by each is phase-shifted with respect to the other,
   an optical receiver with a photodiode for receiving light that contains clock synchronous measurement signal transmitted by the light sources, and with an amplifier unit for amplifying a measurement signal current based on the received measurement signal,
   a clock generator for generating a clock signal,
   a demodulator for clock synchronous evaluation of the measurement signal current,
   a controllable current source for generating a clocked transmission control current for the transmission light source,
   a controllable compensation current source for generating a clocked compensation control current for the compensation light source, and
   a controller unit for generating at least one control signal for the controllable current source and/or compensation current source, wherein the controller unit is designed such that the amplitude of the light intensity of the compensation light source and/or the transmission light source is controllable by controlling the compensation control current and/or the transmission control current in such manner that a clock synchronous signal difference arising between the light emitted by the transmission light source and the light emitted by the compensation light source is reduced to zero,
characterized by
   a controllable basic coupling current source for generating a clocked basic coupling control current,
   a basic coupling light source that is different from the transmission light source and is supplied with the basic coupling control current and transmits light directly to the optical receiver;
   the basic coupling control current is set in such manner that a desired sensitivity of the measurement arrangement is achieved and/or a desired resting value of the controller unit is adjustable,
   wherein in the absence of an object to be detected the controller unit controls the transmission light source and/or the compensation light source in such manner that the measurement signal received from the basic coupling current source is adjusted,
wherein
   the controllable current source for generating a clocked transmission control current and the controllable basic coupling current source for generating a clocked basic coupling control current are clocked with the clock signal of the clock generator, and
   the controllable compensation current source for generating a clocked compensation control current is clocked with the inverted clock signal of the clock generator.

2. An opto-electronic measuring arrangement that is largely independent of extraneous light, comprising
   a transmission light source and a compensation light source, which sequentially emit clocked phased light, wherein the light emitted by each is phase-shifted with respect to the other,
   an optical receiver with a photodiode for receiving light that contains clock synchronous measurement signal transmitted by the light sources, and with an amplifier unit for amplifying a measurement signal current based on the received measurement signal,
   a clock generator for generating a clock signal,
   a demodulator for clock synchronous evaluation of the measurement signal current,
   a controllable current source for generating a clocked transmission control current for the transmission light source,
   a controllable compensation current source for generating a clocked compensation control current for the compensation light source, and
   a controller unit for generating at least one control signal for the controllable current source and/or compensation current source, wherein the controller unit is designed such that the amplitude of the light intensity of the compensation light source and/or the transmission light source is controllable by controlling the compensation control current and/or the transmission control current in such manner that-a clock synchronous signal difference arising between the light emitted by the transmission light source and the light emitted by the compensation light source is reduced to zero,
characterized by
   a controllable basic coupling current source for generating a clocked basic coupling control current,
   the basic coupling control current is set in such manner that a desired sensitivity of the measurement arrangement is achieved and/or a desired resting value of the controller unit is adjustable,
   wherein in the absence of an object to be detected the controller unit controls the transmission light source and/or the compensation light source in such manner that the measurement signal received from the basic coupling current source is adjusted,
wherein
   the controllable current source for generating a clocked transmission control current and the controllable basic coupling current source for generating a clocked basic coupling control current are clocked with the clock signal of the clock generator,
   the controllable compensation current source for generating a clocked compensation control current is clocked with the inverted clock signal of the clock generator, and
   the basic coupling current source supplied with the basic coupling control current is the compensation light source and the measuring arrangement comprises an adder in which the basic coupling control current and the compensation control current are added to together before that are fed to the compensation light source.

3. The measuring arrangement according to claim 1, characterized in that the transmission light source is arranged in such manner that the basic coupling between the transmission light source and the photodiode constitutes not more than 50% of the functional optical object coupling generated by the transmission light source.

4. The measuring arrangement according to claim 1, characterized in that the transmission light source is arranged in such manner that the basic coupling between the transmission light source and the photodiode constitutes not more than 20% of the functional optical object coupling generated by the transmission light source.

5. The measuring arrangement according to claim 1, characterized in that the transmission light source is arranged in such manner that the basic coupling between the transmission light source and the photodiode constitutes not more than 5% of the functional optical object coupling generated by the transmission light source.

6. The measuring arrangement according to claim 1, characterized in that the transmission light source is arranged in such manner that no direct basic coupling between the transmission light source and the photodiode exists.

7. The measuring arrangement according to claim 1, characterized in that the basic coupling control current is set such that the electro-optical basic coupling of the compensation light source is generated and/or changed.

8. The measuring arrangement according to claim 1, characterized in that the transmission light source, the basic coupling light source and/or the compensation light source are each designed in the form of an LED.

9. The measuring arrangement according to claim 1, characterized in that the basic coupling current source is designed by the current source for generating a clocked transmission control current for the transmission light source.

10. The measuring arrangement according to claim 1, characterized in that the basic coupling current source is designed by the current source for generating a clocked transmission control current for the transmission light source, and a current splitter is provided in the form of Ohmic resistors.

11. The measuring arrangement according to claim 9, characterized in that the basic coupling current source is designed by the current source for the transmission light source and an Ohmic current splitter with a diode.

12. The measuring arrangement according to claim 9, characterized in that the basic coupling current source is designed by the current source for the transmission light source and an Ohmic current splitter with a Schottky diode.

13. The measuring arrangement according to claim 9, characterized in that the basic coupling current source is designed by the current source for the transmission light source and an Ohmic current splitter having at least two transistors.

14. The measuring arrangement according to claim 9, characterized in that the basic coupling current source is designed by the current source for the transmission light source and an Ohmic current splitter having at least two MOSFET transistors.

15. The measuring arrangement according to claim 1, characterized in that the basic coupling current source is formed by the current source for the transmission light source and the basic coupling control source is formed by the parameterized transmission control current, wherein the parameterized basic coupling control current is generated in a chip.

16. The measuring arrangement according to claim 15, characterized in that the basic coupling current source is also adjusted by the controller unit proportionally with the current source.

17. The measuring arrangement according to claim 15, characterized in that the current amplitude of the basic coupling current source can be set permanently for each current source.

18. The measuring arrangement according to claim 1, characterized in that the measuring arrangement comprises a plurality of transmission light sources, which are compensated by the compensation light source sequentially one after the other in respective control loops and for each of which a basic coupling control current is generated.

19. The measuring arrangement according to claim 1, characterized in that the current sources, namely the controllable current source for the transmission light source and the controllable basic coupling current source are supplied by one or more signal transmitters, wherein the signal transmitter is integrated in a chip.

* * * * *